United States Patent [19]
Yang et al.

[11] Patent Number: 5,514,890
[45] Date of Patent: May 7, 1996

[54] ELECTRICALLY ERASABLE PROGRAMMABLE MEMORY DEVICE WITH IMPROVED ERASE AND WRITE OPERATION

[75] Inventors: Sheng-Hsing Yang, Hsinchu; Jyh-Kung Lin, I-Lan, both of Taiwan

[73] Assignee: United Microelectronics Corporation, Hsinchu, Taiwan

[21] Appl. No.: 354,372

[22] Filed: Dec. 12, 1994

Related U.S. Application Data

[62] Division of Ser. No. 239,293, May 6, 1994, Pat. No. 5,376,572.

[51] Int. Cl.$^6$ .................................................. H01L 29/788
[52] U.S. Cl. ................................................ 257/321; 257/316
[58] Field of Search ....................................... 257/321, 316

[56] References Cited

U.S. PATENT DOCUMENTS

| | | | |
|---|---|---|---|
| 4,622,737 | 11/1986 | Ravaglia | 257/321 |
| 5,108,937 | 4/1992 | Tsai et al. | 437/40 |
| 5,210,597 | 5/1993 | Kakiuchi et al. | 257/321 |

OTHER PUBLICATIONS

"A Self-Convergence Erasing Scheme for a Simple Stacked Gate Flash EEPROM", IEDM 91, pp. 307–310.

*Primary Examiner*—Robert P. Limanek
*Attorney, Agent, or Firm*—George O. Saile; William J. Stoffel

[57] ABSTRACT

An improved structure and process of fabricating an electrically erasable programmable read only memory device (EEPROM's) wherein a thick oxide region is formed on the surface of a semiconductor substrate. The thick oxide is removed forming a depression in the surface. Impurity ions are implanted in the depression forming a highly doped tunneling region. A tunnel oxide layer is formed on the substrate surface fully covering the tunneling region. Next, the floating gate layer is formed on the tunnel oxide layer. The gate isolation layer and control gate layer are formed over the floating gate layer. Subsequently, the spaced source and drain regions are formed in the substrate on opposite sides of the gate structure. A dielectric layer is formed over the control gate region and substrate. Contact openings are formed. Electrical contacts and metallurgy lines with appropriate passivation are formed that connect the source, drain and gate elements to form an electrically erasable programmable read only memory device.

14 Claims, 4 Drawing Sheets

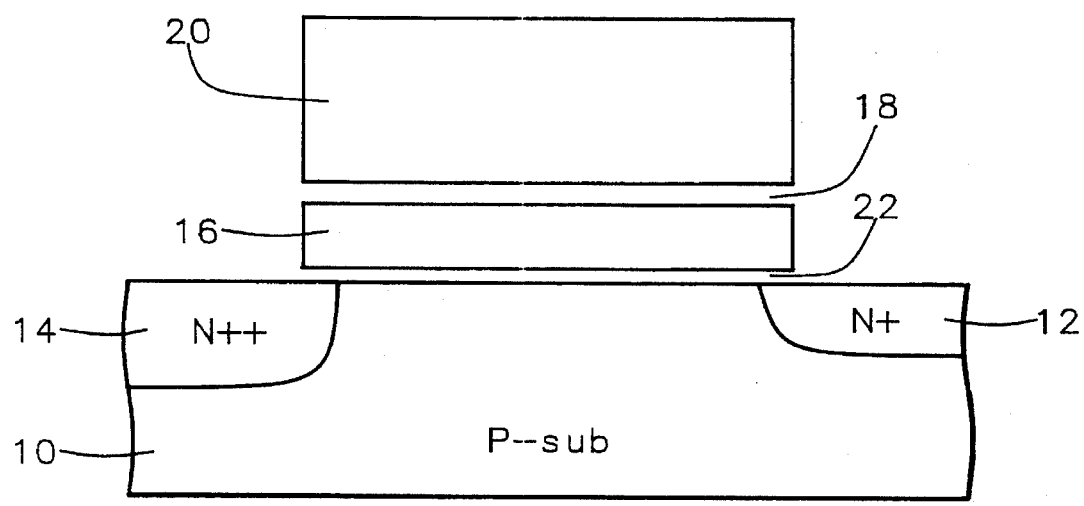
FIG. 1 - Prior Art
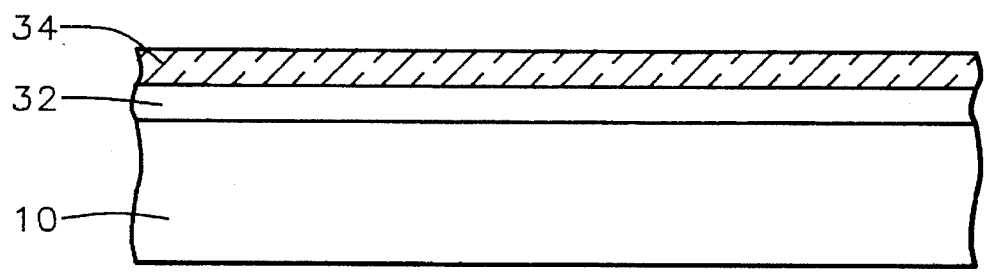
FIG. 2
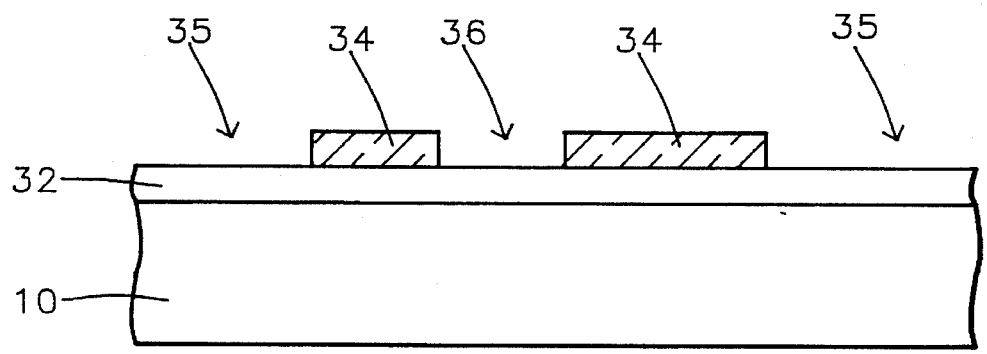
FIG. 3

ELECTRICALLY ERASABLE PROGRAMMABLE MEMORY DEVICE WITH IMPROVED ERASE AND WRITE OPERATION

This application is a division of application Ser. No. 08/239,293, filed May 6, 1994, now U.S. Pat. No. 5,376,572.

BACKGROUND OF INVENTION

1) Field of the Invention

This invention relates to semiconductor devices and more particularly to an improved structure and method for producing electrically programmable read only memory devices (EPROM's) and electrically erasable programmable read only memory devices (EEPROM's).

2) Description of the Prior Art

Computer memories represent one of the fastest growing markets in the world today. Also, computer memory technology is rapidly changing to meet marketplace demands. One of the most important types of computer memory, called an electrically alterable/erasable read only memory (EAROM/EEROM), has a permanent but reprogrammable memory.

Market demands that memories must be faster, smaller and easier to manufacture. In particular there is a challenge to develop stacked gate flash electrically erasable programmable read only memories (EEPROM's or $E^2ROM$'s) with faster erasure speeds without decreasing the device manufacturing yield.

A conventional EEPROM device works as follows. FIG. 1 shows the conventional stacked gate EEPROM programmed transistor. The stacked EEPROM transistor has an additional polysilicon layer added to the conventional complementary metal oxide semiconductor (CMOS) transistor. This additional polysilicon layer is called a floating gate 16. A control gate 20 is placed above the floating gate 16. The floating gate 16 gets its name because it is not attached to a line but "floats" and is controlled by the control gate 20, source 14 and drain 16 voltages. A thin oxide, called the tunnel oxide 22, separates the floating gate 16 from the source 14, and drain 12 voltages. Another thin insulating layer 18 separates the control gate 20 from the floating gate 16. By controlling the control gate, source and drain voltages, the thin tunnel oxide 22 is used to allow electrons to "tunnel" to or from the floating gate 16 to turn the cell off or on respectively. This tunneling mechanism is called Fowler-Nordheim tunneling. Also, by setting the appropriate voltages on the terminals, "hot electrons" can be induced to charge the floating gate 16, thereby programming the transistor.

Still referring to FIG. 1, a memory cell can be programmed by causing hot electrons to be injected from the drain 12 through gate oxide layer 22 onto the floating gate 16. This injection of electrons occurs under the influence of a relatively strong electrical field. Once the strong electrical field has been removed, these electrons are trapped on floating gate 16 causing the memory cell to be programmed. Accordingly, the memory cell may be programmed by placing a memory cell transistor source 14, such as one of bit lines, at a zero volt potential while placing control gate 20 at a relative high positive voltage potential and pulsing a memory cell transistor drain 12, such as bit line with a relatively high voltage. This process causes the floating gate 16 to become charged or programmed.

A memory cell may be read by placing a memory cell transistor source 14 at a zero volt potential, a memory cell transistor drain 12 at a relatively low positive voltage. If the memory cell has not been previously programmed, then the memory cell conducts current. However, if the memory cell has been previously programmed, floating gate 16 will prevent the memory cell from conducting.

In the conventional floating gate cell structure, the erase operation speed is limited by the electric field strength between source and the floating gate which is limited by the tunnel oxide thickness. The thinner the tunnel oxide thickness the faster the electrons can "tunnel" thorough it. This is because the thinner the tunnel oxide the stronger the electric field between the floating gate and the source or drain. However, as the tunnel oxide is thinned, oxide pin holes cause reliability problems. In practice, the tunnel oxide thickness is formed at the lowest thickness to ensure acceptable reliability and manufacturing yields. This tradeoff between tunnel oxide thickness and erase speed limits the overall speed of conventional EEPROM devices.

A method for fabricating a MOS field effect transistor with a recessed gate with self-aligning source and drain regions is shown in U.S. Pat. No. 5,108,937. The erasure rate for this device is still limited by the tunnel oxide thickness.

A new erasing method for a simple stacked gate flash EEPROM is describe in Yamada et all, "A Self-Convergence Erasing Scheme For a Simple Stacked Gate Flash EEPROM", IEDM 91 pp. 307–310. This publication explains a technique to improve cell erasure. Standard cell erasure is achieved by electron tunneling (Fowler-Nordheim or F-N tunneling) between the floating gate and the drain. Yamada's technique makes use of avalanche hot carrier injection after cell erasure by Fowler-Nordheim (F-N) tunneling. A steady state is caused by a balance between the avalanche hot electron injection into the floating gate and the avalanche hot hole injection into the floating gate. This steady state can be controlled by the channel doping level. This new technique results in a tighter distribution of erase threshold voltages. It also allows pre-programming and iteration of the erase and verify sequence to be eliminated. However, the erase step speed is still limited by the the tunnel oxide thickness and the electric field strength between the floating gate and the source.

SUMMARY OF INVENTION

It is a general object of the invention to provide an improved structure for an improved electrically programmable read only memory devices.

An more specific object of the present invention is to provide an improved electrically programmable read only memory device with an improved source and floating gate structure which provides for faster write and erase operations.

Another object of the present invention is to provide a process to fabricate an electrically programmable read only memory devices with an improved source and floating gate structure.

In accordance with the above objects, a structure and a method for an improved EPROM is provided. A thin insulating layer and an oxidation resistant masking layer are formed on the surface of a semiconductor substrate having a background dopant of a first conductivity type. Openings are formed in the masking layer that define the field oxide regions. Also, a first opening is formed in the masking layer. Next, oxide is grown in the openings forming field oxide regions and thick oxide is formed in the first opening. The masking layer is then removed.

A resist layer with a second opening defining the highly doped tunneling regions is formed on the substrate surface. The thick oxide in the second opening is removed exposing a depression with rounded bottom corners in the substrate surface. Ions of a second opposite conductivity type are implanted through the second opening to form the highly doped tunneling region. The resist layer and remaining thin insulating layer are then removed.

Next, a tunnel oxide layer is formed on the substrate surface. Now, a floating gate layer is formed on the tunnel oxide layer so that it fully overlies the highly doped tunneling region. After this, a gate isolation layer and control gate layer are formed over the floating gate layer.

Then, the source and drain regions are formed in the substrate on opposite sides of the gate structure. The region of the substrate between the tunneling region on the drain is call the channel region. Afterwards, a dielectric layer is formed over the control gate region and substrate. Contact opening are formed. Electrical contacts and metallurgy lines with appropriate passivation are formed that connect the source, drain and gate elements to form an electrically programmable memory device.

An important feature of the invention is the depression with round corners in the highly doped tunneling area which increases the device erasure speed without affecting device yields. The depression formed in the highly doped tunneling region increases the electric field between the floating gate and the highly dope source. This increases the Fowler-Nordheim electron tunneling between the highly doped source and the floating gate thus increasing the EPROM erase and write speeds.

BRIEF DESCRIPTION OF THE DRAWINGS

The drawings show the following:

FIG. 1 is cross-sectional view in broken section in greatly enlarged scale that illustrates a process for forming an electrically programmable memory device in accordance with the prior art process.

FIGS. 2 through 9 are a sequence of cross-sectional views in broken section in greatly enlarged scale that illustrate the improved electrically programmable memory device at various stages of fabrication in accordance with the process of the invention.

DETAILED DESCRIPTION OF THE PREFERRED EMBODIMENTS

The present inventions will be described in detail with reference to the accompanying drawings. It should be noted that the drawings are in greatly simplified form. In practice the memory device structure will be one of many supported on a common substrate connected with suitable metallurgy in various electronic circuit configurations.

Referring now to FIG. 2, memory array 11 contains a multiplicity of memory cells. Typically, all memory cells within memory array 11 are constructed as a result of the same process steps, and therefore all cells are similar in structure. Consequently, the entire array 11 of memory cells is described herein by reference to only the few cells depicted in FIGS. 2 through 9. It will be understood by those skilled in the are that many memory cells may reside both to the left and the right of the cells depicted in FIGS. 2–9 All distance extending in this dimension of memory array 11 are characterized as widths herein. In addition, many memory cells may reside both above and below the cells shown in FIGS. 2–9 All distances extending in this dimension are referred to as lengths herein.

Referring now to FIG. 2, there is shown substrate 10 which shall be a monocrystalline silicon semiconductor body with many devices fabricated therein, as is well known in the art. The substrate 10 is preferable formed of monocrystalline silicon having a surface plane with a crystalline orientation of <1 0 0>. The background substrate dopant is preferably boron, with a concentration typically in the range of 1E14 to 1E15 atoms/cm$^3$. Substrate 10, embodies a background doping of a first conductivity type, preferably P-type. Next, a thin insulating layer 32 is formed on the surface of the semiconductor substrate, The thin insulating layer 32 is preferably composed of silicon oxide with a thickness in the range of 300 to 500 angstroms and preferably a thickness of approximately 400 angstroms.

An oxidation resistant masking layer 34 is then formed over the thin insulating layer 32. The oxidation resistant masking layer 34 is preferably formed of silicon nitride with a thickness in the range of 1000 to 2000 angstroms and with a thickness more preferably 1500 angstroms. Layer 34 can be formed of silicon nitride layer by reacting silane and ammonia at atmospheric pressure at 700° to 900° C., or by reacting dichlorosilane and ammonia at reduced pressure at approximately 700° C. Also, silicon nitride can be formed by plasma enhanced chemical vapor deposition by reacting silane with ammonia or nitrogen in a glow discharge between 200° and 350° C.

Figure 4:
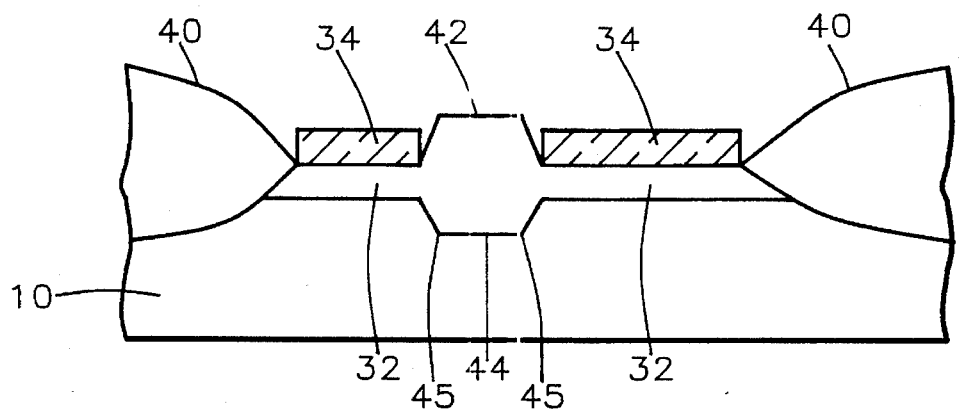

Now referring to FIG. 3, openings 35 in masking layer 34 are formed that define the thick field oxide regions 38. Also, a first opening 36 is formed which defines the highly doped tunneling region. As shown in FIG. 4 thick field oxide 40 is formed in the openings 35 that define the field oxide layer. Also a thick oxide 42 is formed in said first opening 36. The field oxide layer 40 has a thickness in the range of 5000 to 10,000 angstroms and more preferably a thickness of 6000 angstroms. The thick oxide 42 has a thickness in the range of 5000 to 10,000 angstroms and more preferably a thickness of 6000 angstroms. Field oxides layer 40 and thick oxide layer 42 can be formed by a conventional atmospheric thermal process where water vapor is reacted with the exposed substrate at a temperature in the range of 700° to 1200° C. In the reaction forming the oxide layer 40 and 42, a portion of the underlying silicon is consumed. Typically, for a given silicon oxide thickness, the amount of substrate consumed is approximately one half of the oxide thickness. As illustrated in FIG. 4, this consumption of the silicon substrate forms a depression 44 with bottom rounded corners 45 in substrate surface. This depression is an important feature of this invention and will be discussed below.

Figure 5:
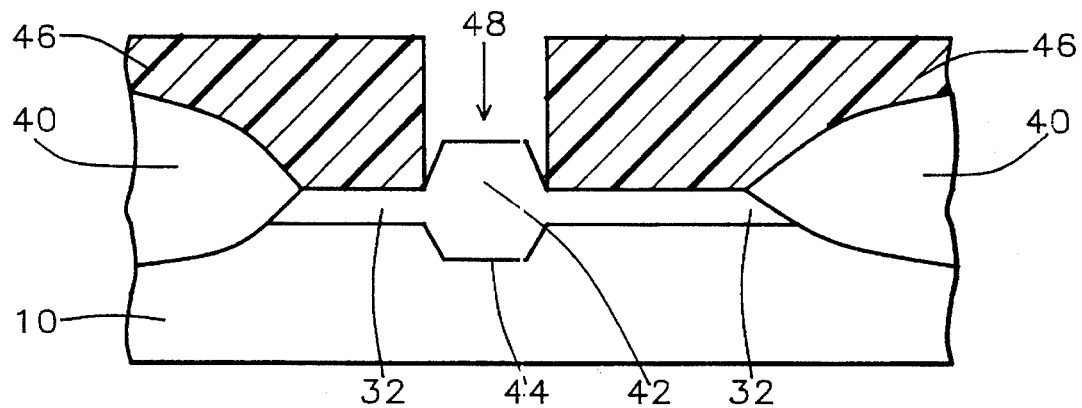

FIG. 5 shows the oxidation masking layer 34 removed. Layer 34 can be removed by any etch process that has a high silicon nitride to silicon oxide selectivity such as a reactive ion etch using $CH_2F_2$ or $CH_3F$ as source gases. Next, a resist layer 46 is formed over the substrate surface with a second opening 48 over said first opening 36.

Figure 6:
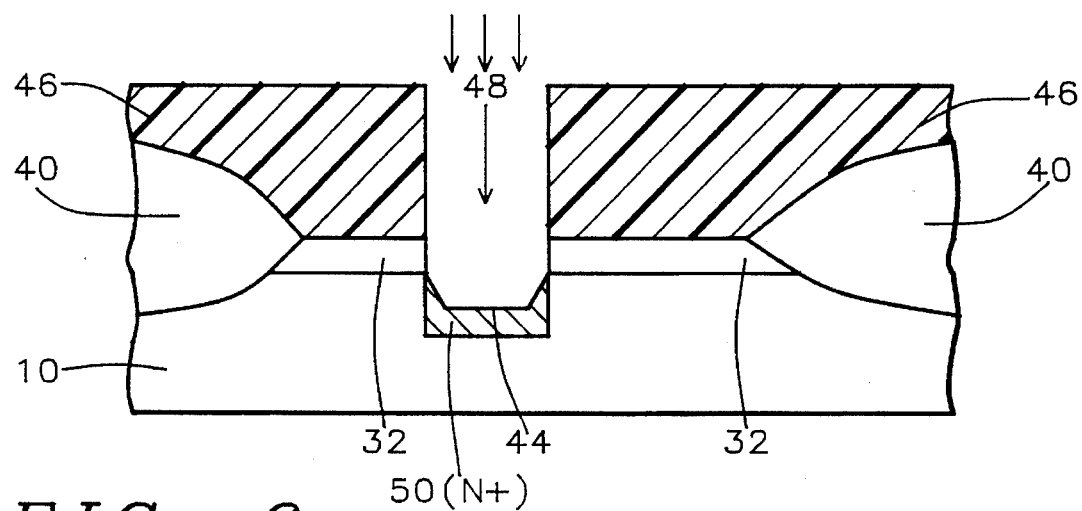

Referring to FIG. 6, the thick oxide 42 that is exposed through the second opening 48 is completely removed thereby revealing the depression 44 in the substrate surface. The thick oxide region 42 can be removed by a buffered oxide etch. The surface depression 44 has a depth in the range of 2500 to 5000 angstroms. The width of the depression 44 is in the range of 0.8 to 1.2 microns.

Then as shown on FIG. 6, ions of a second conductivity type are implanted into the substrate 10 through the second opening forming a highly doped tunneling region 50, The highly doped tunneling region 50 is formed by ion implantation with an implant energy in the range of 50 to 80 Kev. and dosage in the range of 1E14 to 1E15 atoms/cm$^2$. The ion implanted to form highly doped source can be arsenic, or phosphorus ions. Highly doped tunneling region 50 has an impurity concentration in the range of 1E19 to 1E21 atoms/cm$^3$. Next the resist layer 46 and the remaining thin insulation layer 38 is removed.

Figure 7:
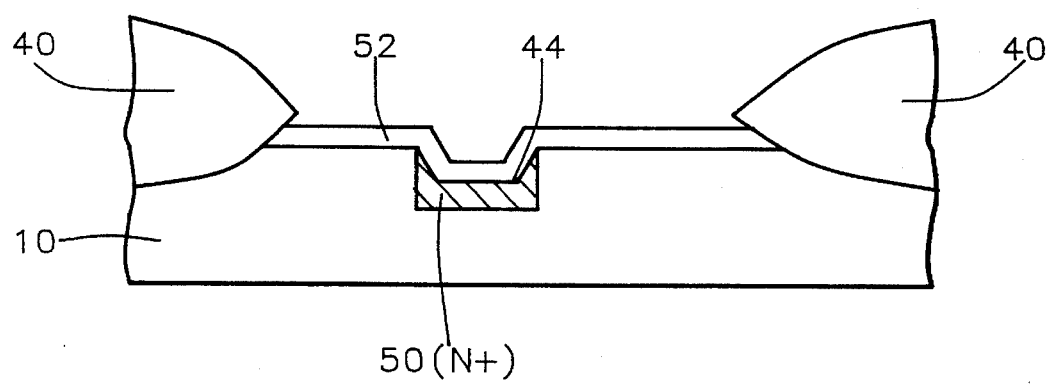

FIG. 7 shows the formation of the tunnel oxide layer 52 on the exposed substrate. The tunnel oxide layer 52 has thickness is in the range of 80 to 120 angstroms and a thickness more preferably 100 angstroms.

Figure 8:
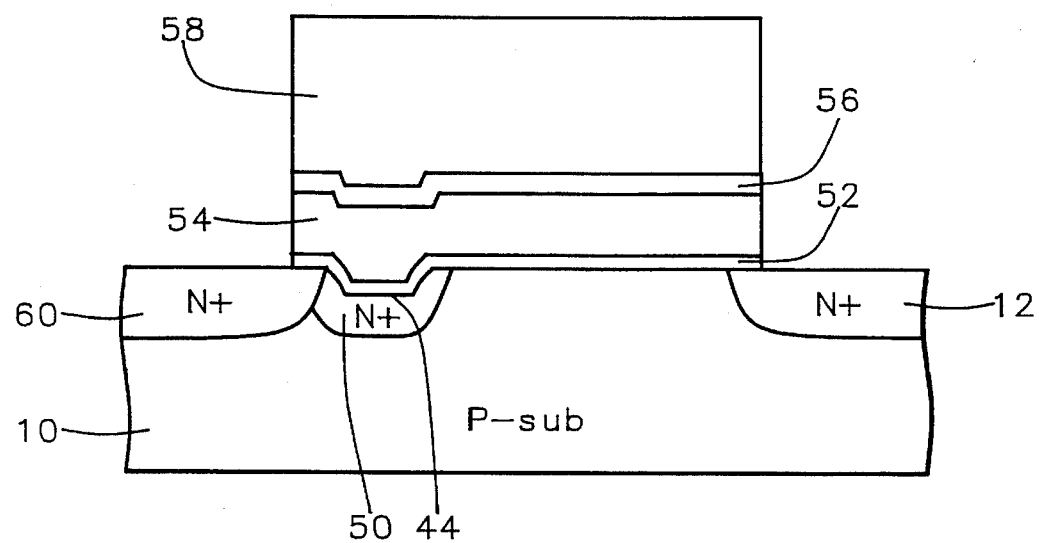

As FIG. 8 shows a floating gate 54 is formed on the tunnel oxide layer 52 that fully overlaps said highly doped tunneling region 50. The floating gate 54 can be formed of polycrystalline silicon material. The polycrystalline silicon floating gate 54 can be deposited by prolyzing silane in a low pressure chemical vapor deposition process at approximately 620° C.

The floating gate 54 must fully overlap the rounded bottom corners 45 of the depression 44 because the greatest electrical field is created in these corners 45. This high electric field enables electrons to tunnel faster and results in faster erase rates for a given tunnel oxide thickness.

Following this, a gate isolation layer 56 is formed on the floating gate layer 54. Layer 56 can be formed of any suitable material, but is preferably a composite layer of silicon oxide, silicon nitride and silicon oxide, which is called "ONO". The gate isolation layer 56 preferably has a total thickness in the range of 250 to 450 angstroms and more preferably a thickness of approximately 350 angstroms. The bottom silicon oxide ($SiO_2$) layer has a thickness the range of 60 to 120 angstroms. The bottom silicon oxide layer is form by a conventional thermal oxidation process. The middle nitride layer has a thickness in the range of 100 to 200 angstroms. The nitride layer is form by low pressure chemical vapor deposition. The second top oxide layer has a thickness in the range of 20 to 50 angstroms. The second oxide layer is formed on the nitride surface and can be formed by thermal oxidation. In the alternative, layer 56 can be formed of silicon oxide using a low pressure chemical vapor deposition (LPCVD) or a plasma enhanced chemical vapor deposition (PECVD) process.

A control gate layer 58 is formed over the floating gate layer 54 and the gate isolation layer 56. The control gate layer 58 can be formed of polycrystalline silicon.

Next, an ion implantation masking layer is formed with openings which define the source and drain regions. The source and drain regions can also be defined using a conventional self-aligned photolithographic process. Impurity ions are implanted into the substrate to form source 60 and drain 62 regions. The source 60 and drain 62 regions are formed by ion implantation with a implant energy in the range of 50 to 80 Kev. and dosage in the range of 2E15 to 8E15 atoms/cm$^2$. The source and drain dopant ions can be phosphorus or arsenic ions.

Figure 9:
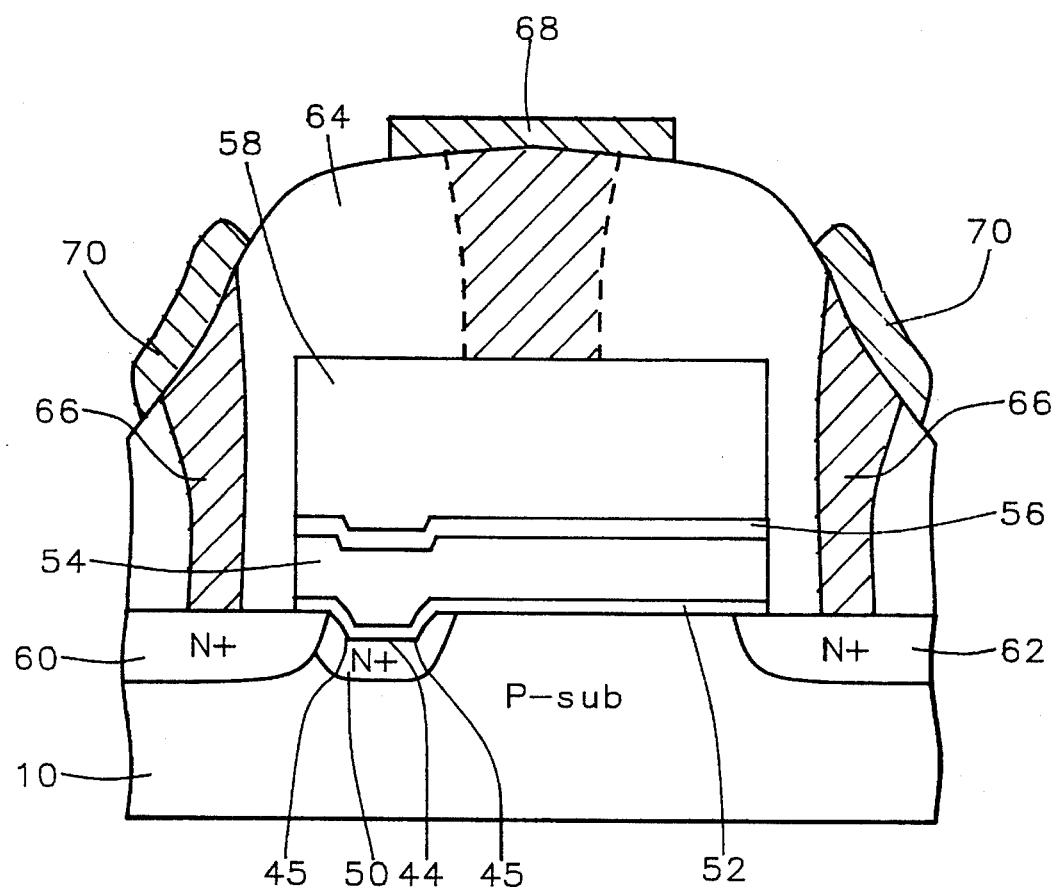

As shown in FIG. 9, a dielectric layer 64 is formed over the control gate electrode and substrate. The dielectric layer 64 can be formed of borophosphosilicate glass (BPSG) by low pressure chemical vapor deposition (LPCVD) using tetraethylorthosilicate (TEOS) as a reactant. Boron and phosphorus are added to the ambient during the formation of the borophosphosilicate glass layer. The layer 64 is thermally treated at a temperature of 850° C. for 30 minutes to cause flow and planarization. In the alternative, dielectric layer 64 can be formed of BPSG by a conventional plasma enhanced chemical vapor deposition (PECVD). Lastly, electrical contacts 66,68,70 are formed to the source 60, drain 62, and gate 58 regions.

While the invention has been particularly shown and described with reference to the preferred embodiments thereof, it will be understood by those skilled in the art that various changes in form and details may be made without departing from the spirit and scope of the invention.

What is claimed is:

1. An improved electrically erasable programmable read only memory device comprising:

a semiconductor substrate having the background dopant of a first conductivity type;

spaced source and drain regions of a second opposite conductivity type separated by a channel region in said substrate;

a highly doped tunneling region disposed between the source region and drain region with said tunneling region being separate from said source region; and said tunneling region being adjacent to said source region;

a tunnel oxide on said substrate overlying at least said channel region;

a floating gate overlying said tunnel oxide and fully overlying said highly doped tunneling region;

a gate insulation layer over said floating gate region;

a control gate region overlying said floating gate;

a surface depression in said substrate over said highly doped tunneling region; said surface depression having a depth from the substrate surface in the range of 2500 to 5000 angstroms and a width in the range of 0.8 to 1.2 microns and said surface depression having rounded corners;

a portion of said tunnel oxide extending into and fully covering said depression;

and a portion of said floating gate extending into and fully covering said depression.

2. An improved electrically erasable programmable read only memory device comprising:

a semiconductor substrate having the background dopant of a first conductivity type;

spaced source and drain regions of a second opposite conductivity type separated by a channel region in said substrate;

a highly doped tunneling region disposed between the source region and drain region and said highly doped tunneling region adjacent to said source region;

a tunnel oxide on said substrate overlying at least said channel region;

a floating gate overlying said tunnel oxide and fully overlying said highly doped tunneling region;

a gate insulation layer over said floating gate region;

a control gauge region overlying said floating gate;

a surface depression in said substrate over said highly doped tunneling region; said surface depression having a depth from the substrate surface in the range of 2500 to 5000 angstroms and a width in the range of 0.8 to 1.2 microns and said surface depression having rounded corners;

a portion of said tunnel oxide extending into and fully covering said depression;

and a portion of said floating gate extending into and fully covering said depression.

3. The device of claim 2 wherein the background impurity of a first conductivity type is P-type and the impurity of a second conductivity type is N-type.

4. The device of claim 2 wherein the source and drain regions are formed by ion implantation with an implant energy in the range of 50 to 80 Kev. and dosage in the range of 2E15 to 8E15 atoms/cm$^2$.

5. The device of claim 2 wherein the highly doped tunneling region has an impurity concentration in the range of 1E19 to 1E21 atoms/cm$^3$.

6. The device of claim 2 wherein the tunnel oxide thickness is in the range of 80 to 120 angstroms.

7. The device of claim 2 wherein the gate isolation layer is a three layer sandwich structure consisting of a silicon oxide layer, a silicon nitride layer and a silicon oxide layer.

8. An improved electrically erasable programmable read only memory device comprising:

a semiconductor substrate having the background dopant of a first conductivity type;

spaced source and drain regions of a second opposite conductivity type separated by a channel region in said substrate;

a highly coped tunneling region disposed between the source region and drain region and said highly doped tunneling region adjacent to said source region;

a tunnel oxide on said substrate overlying at least said channel region;

a floating gate overlying said tunnel oxide and fully overlying said highly doped tunneling region;

a gate insulation layer over said floating gate region;

a control gauge region overlying said floating gate;

a surface depression in said substrate over said highly doped tunneling region; said surface depression having a depth from the substrate surface in the range of 2500 to 5000 angstroms;

a portion of said tunnel oxide extending into and fully covering said depression;

and a portion of said floating gate extending into and fully covering said depression.

9. The device of claim 8 wherein the background impurity of a first conductivity type is P-type and the impurity of a second conductivity type is N-type.

10. The device of claim 8 wherein the source and drain regions are formed by ion implantation with an implant energy in the range of 50 to 80 Kev. and dosage in the range of 2E15 to 8E15 atoms/cm$^2$.

11. The device of claim 8 wherein the highly doped tunneling region has an impurity concentration in the range of 1E19 to 1E21 atoms/cm$^3$.

12. The device of claim 8 wherein the tunnel oxide thickness is in the range of 80 to 120 angstroms.

13. The device of claim 8 wherein said surface depression having a width in the range of 0.8 to 1.2 microns and said depression having rounded corners.

14. The device of claim 8 wherein the gate isolation layer is a three layer sandwich structure consisting of a silicon oxide layer, a silicon nitride layer and a silicon oxide layer.

* * * * *